United States Patent
Thakur et al.

(10) Patent No.: US 6,187,628 B1
(45) Date of Patent: *Feb. 13, 2001

(54) SEMICONDUCTOR PROCESSING METHOD OF FORMING HEMISPHERICAL GRAIN POLYSILICON AND A SUBSTRATE HAVING A HEMISPHERICAL GRAIN POLYSILICON LAYER

(75) Inventors: Randhir P. S. Thakur, Boise; Michael Nuttall, Meridian; John K. Zahurak; John P. Friedenreich, both of Boise, all of ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/803,689

(22) Filed: Feb. 24, 1997

Related U.S. Application Data

(63) Continuation of application No. 08/518,525, filed on Aug. 23, 1995, now abandoned.

(51) Int. Cl.[7] .................................................. H01L 21/70
(52) U.S. Cl. ........................................... 438/255; 438/398
(58) Field of Search .................................. 438/255, 398, 438/964, FOR 220, FOR 430, FOR 488; 148/DIG. 138, DIG. 14; 257/309

(56) References Cited

U.S. PATENT DOCUMENTS

| | | | |
|---|---|---|---|
| 4,676,847 | * | 6/1987 | Lin ........................................ 438/564 |
| 5,093,700 | * | 3/1992 | Sakata .................................. 257/288 |
| 5,191,509 | * | 3/1993 | Wen ..................................... 438/964 |
| 5,208,479 | * | 5/1993 | Mathews et al. ..................... 438/398 |
| 5,278,091 | * | 1/1994 | Fazan et al. .......................... 437/977 |
| 5,340,765 | * | 8/1994 | Dennison et al. ...................... 437/60 |
| 5,366,917 | * | 11/1994 | Watanabe et al. ...................... 437/60 |
| 5,387,531 | * | 2/1995 | Rha et al. ............................. 437/972 |
| 5,407,534 | * | 4/1995 | Thakur ................................... 437/60 |
| 5,429,980 | * | 7/1995 | Yang et al. ............................. 437/60 |
| 5,444,013 | * | 8/1995 | Akram et al. .......................... 437/60 |
| 5,639,685 | * | 6/1997 | Zahurak et al. ...................... 438/398 |
| 5,691,228 | * | 11/1997 | Ping et al. ............................ 438/398 |
| 5,716,862 | * | 2/1998 | Ahmad et al. ........................ 438/255 |

FOREIGN PATENT DOCUMENTS 5-175456 * 7/1993 (JP) ..................................... 437/977

OTHER PUBLICATIONS

Silicon Processing for the VLSI Era, vol. 1 Process Technology, Wolf et al., 1986, pp. 168–171.*

* cited by examiner

*Primary Examiner*—Savitri Mulpuri
(74) *Attorney, Agent, or Firm*—Wells, St. John, Roberts, Gregory & Matkin PS

(57) ABSTRACT

A semiconductor processing method of depositing a hemispherical grain polysilicon layer on a substrate includes, a) chemical vapor depositing a layer of silicon atop a substrate within a chemical vapor deposition reactor at a selected temperature and at a selected pressure; b) without removing the substrate from the reactor after providing the silicon layer, and without exposing the substrate to surface cleaning conditions within the reactor after providing the silicon layer, in situ exposing the silicon layer to oxidizing conditions within the reactor effective to grow a layer of silicon dioxide to a thickness of at least 5 Angstroms; and c) without removing the substrate from the reactor after the oxidizing step, in situ chemical vapor depositing a layer of hemispherical grain polysilicon over the silicon dioxide layer. Alternately, an oxide layer is chemical vapor deposited as opposed to grown by oxidation. Substrates produced according to the method are also disclosed.

1 Claim, 1 Drawing Sheet

SEMICONDUCTOR PROCESSING METHOD OF FORMING HEMISPHERICAL GRAIN POLYSILICON AND A SUBSTRATE HAVING A HEMISPHERICAL GRAIN POLYSILICON LAYER

This patent resulted from a file wrapper continuation of U.S. patent application Ser. No. 08/518,525, filed Aug. 23, 1995, and now abandoned.

TECHNICAL FIELD

This invention relates to the formation of hemispherical grain polysilicon films in semiconductor wafer processing.

BACKGROUND OF THE INVENTION

The reduction in memory cell size required for high density dynamic random access memories (DRAMs) results in a corresponding decrease in the area available for the storage node of the memory cell capacitor. Yet, design and operational parameters determine the minimum charge required for reliable operation of the memory cell despite decreasing cell area. Several techniques have been developed to increase the total charge capacity of the cell capacitor without significantly affecting the cell area. These include structures utilizing trench and stacked capacitors, as well as the utilization of new capacitor dielectric materials having higher dielectric constants.

One common material utilized for capacitor plates is conductively doped polysilicon. Such is utilized because of its compatibility with subsequent high temperature processing, good thermal expansion properties with $SiO_2$, and its ability to be conformally deposited over widely varying topography.

As background, silicon occurs in crystalline and amorphous forms. Further, there are two basic types of crystalline silicon known as monocrystalline silicon and polycrystalline silicon. Polycrystalline silicon, polysilicon for short, is typically in situ or subsequently conductively doped to render the material conductive. Monocrystalline silicon is typically epitaxially grown from a silicon substrate. Silicon films deposited on dielectrics (such as $SiO_2$ and $Si_3N_4$) result in either an amorphous or polycrystalline phase. Specifically, it is generally known within the prior art that silicon deposited at wafer temperatures of less than approximately 580° C. will result in an amorphous silicon layer, whereas silicon deposited at temperatures higher than about 580° C. will result in a polycrystalline layer. The specific transition temperature depends on the source chemicals/precursors used for the deposition.

The prior art has recognized that capacitance of a polysilicon layer can be increased merely by increasing the surface roughness of the polysilicon film that is used as a capacitor storage node. Such roughness is typically transferred to the cell dielectric and overlying polysilicon layer interfaces, resulting in a larger surface area for the same planar area which is available for the capacitor. One procedure utilized to achieve surface roughening involves deposition under conditions which are intended to inherently induce a rough or rugged upper polysilicon surface. Such include low pressure chemical vapor deposition (LPCVD) techniques. Yet, such techniques are inherently unpredictable or inconsistent in the production of a rugged polysilicon film.

One type of polysilicon film which maximizes a roughened outer surface area is hemispherical grain (HSG) polysilicon typically provided to a thickness of from 300 Angstroms to 400 Angstroms. Such can be deposited or grown by a number of techniques. One technique includes direct LPCVD formation at 590° C. Another includes formation by first depositing an amorphous silicon film at 550° C. using He diluted $SiH_4$ (20%) gas at 1.0 Torr, followed by a subsequent high temperature transformation anneal. Regardless, existing techniques subject the substrate to an HF dip prior to HSG formation. The HF dip was conducted to leave bonded hydrogen atoms at the outer surface of the underlying layer. This outer exposed hydrogen was believed to function as a necessary seed layer for formation of the HSG poly during subsequent deposition.

Needs remain for providing improved methods of depositing rough HSG polysilicon on a substrate in semiconductor processing.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
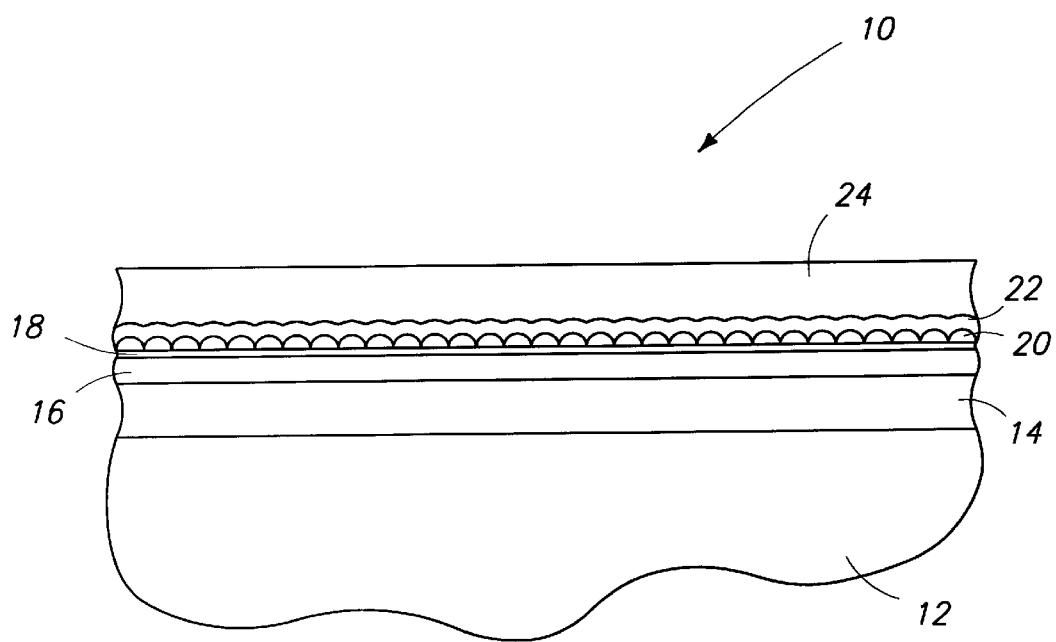
FIG. 1 is a diagrammatic fragmentary sectional view of a semiconductor wafer fragment produced in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of depositing a hemispherical grain polysilicon layer on a substrate comprises the following sequential steps:

chemical vapor depositing a layer of silicon atop a substrate within a chemical vapor deposition reactor at a selected temperature and at a selected pressure;

without removing the substrate from the reactor after providing the silicon layer, and without exposing the substrate to surface cleaning conditions within the reactor after providing the silicon layer, in situ exposing the silicon layer to oxidizing conditions within the reactor effective to grow a layer of silicon dioxide to a thickness of at least 5 Angstroms; and without removing the substrate from the reactor after the oxidizing step, in situ chemical vapor depositing a layer of hemispherical grain polysilicon over the silicon dioxide layer.

It has been discovered that an HF dip of the substrate to leave exposed hydrogen atoms is not a required means for producing HSG polysilicon. HSG polysilicon layers can now be provided by processes in accordance with the invention disclosed herein, which is limited only by the accompanying claims appropriately interpreted in accordance with the doctrine of equivalents. Such a process is described with reference to FIG. 1 in the formation of a capacitor construction. FIG. 1 illustrates a semiconductor wafer fragment indicated generally with reference numeral 10. Such comprises a bulk monocrystalline silicon substrate 12 having an overlying insulating dielectric layer 14, such as $SiO_2$. A layer 16 of silicon is chemical vapor deposited atop the substrate, comprised of layers 14 and 12, within a chemical vapor deposition reactor at a selected temperature and at a selected pressure. Preferably, layer 16 will be provided as polysilicon which is in situ electrically conductively doped. Example feed gases for providing a polysilicon layer 16 include silanes and appropriate dopant gases. An example preferred selected temperature range is from 400° C. to 750° C., with an example preferred pressure range being from 70 mTorr to 250 mTorr.

Then, and without removing the substrate from the chemical vapor deposition reactor, silicon layer 16 is in situ exposed to oxidizing conditions within the reactor effective to grow a layer 18 of silicon dioxide to a thickness of at least 5 Angstroms. In the described capacitor construction, the silicon dioxide layer is preferably provided to a thickness which is no greater than 60 Angstroms. Example and preferred oxidation conditions include exposing the substrate to one or a combination of $O_2$ and $O_3$ at from 100 Torr to atmospheric pressure and at temperature range of from 500° C. to 900° C. By way of example only, alternate oxidizing conditions include exposing the substrate to one or a combination of NO or $N_2O$ at a pressure of no greater than 1 Torr and a temperature of from 500° C.–900° C. Another alternate includes steam oxidation. Alternatively but less preferred, oxide layer 18 can be provided by a chemical vapor deposition process as opposed to an oxidation growth process.

Preferably and advantageously, the substrate need not be exposed to any cleaning conditions within the reactor after providing silicon layer 16. Alternately but less preferred, layer 16 could be exposed to vapor cleaning conditions within the reactor, such as exposure to gaseous HF. However in accordance with the invention, it is not required that hydrogen be provided at the outer surface of the underlying silicon layer to adequately seed subsequent HSG growth.

In accordance with the invention, the substrate remains in the reactor and is not removed therefrom after the oxidizing step, but rather is subjected to ill situ chemical vapor deposition to provide a layer 20 of hemispherical grain polysilicon over silicon dioxide layer 18. Example conditions for providing the HSG include prior art conditions utilizing silane and appropriate dopant feed gases. Example temperature conditions are from 500° C.–600° C., with example pressure ranging from 70 mTorr to 50 Torr. An example and preferred thickness for layer 20 is from 300 Angstroms to 1000 Angstroms.

Subsequently, a capacitor dielectric layer 22 is provided to an example thickness of at least 20 Angstroms. Layer 22 preferably comprises a composite of oxide-nitride-oxide. Subsequently, an electrically conductive outer polysilicon plate 24 is provided. Accordingly, layer 24 comprises one capacitor plate, while the electrically conductive composite of layers 16, 18 and 20 comprises a second capacitor plate.

Preferably, the substrate is maintained at the same selected temperature throughout the two chemical vapor depositing and the oxidizing steps, with an example temperature being 600° C. Where the oxidizing step is conducted at a higher temperature than the initial chemical vapor deposition step, the reactor is preferably ramped to the higher oxidizing temperature from the deposition temperature at a rate no greater than 10° C./min. Preferably, the chemical vapor deposition steps are conducted at sub-atmospheric pressures, while the oxidizing step is conducted at atmospheric pressure.

The invention also contemplates products produced by the above described process.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of depositing a hemispherical grain polysilicon layer on a substrate comprising the following sequential steps:

chemical vapor depositing a layer of polysilicon atop a substrate within a chemical vapor deposition reactor at a [selected] temperature of between approximately 580° C. to 700° C. and at sub-atmospheric pressure;

without removing the substrate from the reactor after depositing the polysilicon layer, in situ exposing the polysilicon layer to oxidizing conditions within the reactor effective to grow a layer of silicon dioxide to a thickness of from 35 Angstroms to 60 Angstroms, the oxidizing conditions comprising atmospheric pressure and $O_3$; and without removing the substrate from the reactor after the oxidizing step, and without exposing the substrate to HF after chemical vapor depositing the layer of polysilicon, in situ chemical vapor depositing a layer of hemispherical grain polysilicon over the silicon dioxide layer at sub-atmospheric pressure, the hemispherical grain polysilicon being formed to a thickness of from 750 Angstroms to 1000 Angstroms.

* * * * *

UNITED STATES PATENT AND TRADEMARK OFFICE
CERTIFICATE OF CORRECTION

PATENT NO. : 6,187,628 B1
DATED : February 13, 2001
INVENTOR(S) : Randhir P.S. Thakur et al.

It is certified that error appears in the above-identified patent and that said Letters Patent is hereby corrected as shown below:

Column 3,
Line 33, please delete "ill" and insert -- "in" after to.

Column 4,
Line 30, please delete "[selected]" after "a".

Signed and Sealed this

Twelfth Day of June, 2001

*Attest:*

NICHOLAS P. GODICI
*Attesting Officer*   *Acting Director of the United States Patent and Trademark Office*

UNITED STATES PATENT AND TRADEMARK OFFICE
CERTIFICATE OF CORRECTION

PATENT NO. : 6,187,628 B1
DATED : February 13, 2001
INVENTOR(S) : Randhir P.S. Thakur et al.

Page 1 of 1

It is certified that error appears in the above-identified patent and that said Letters Patent is hereby corrected as shown below:

Column 3,
Line 33, please delete "ill" and insert -- "in" after to.

Column 4,
Line 30, please delete "[selected]" after "a".

Signed and Sealed this

Twenty-fourth Day of July, 2001

Attest:

*Nicholas P. Godici*

NICHOLAS P. GODICI
*Acting Director of the United States Patent and Trademark Office*

*Attesting Officer*